US008911060B2

(12) United States Patent
Drury

(10) Patent No.: US 8,911,060 B2
(45) Date of Patent: Dec. 16, 2014

(54) PASSIVATION OF PRINTHEAD ASSEMBLIES AND COMPONENTS THEREFOR

(75) Inventor: Paul R. Drury, Hertfordshire (GB)

(73) Assignee: Xaar Technology Limited, Cambridgeshire (GB)

( * ) Notice: Subject to any disclaimer, the term of this patent is extended or adjusted under 35 U.S.C. 154(b) by 747 days.

(21) Appl. No.: 11/915,814

(22) PCT Filed: May 30, 2006

(86) PCT No.: PCT/GB2006/001959
§ 371 (c)(1),
(2), (4) Date: Nov. 28, 2007

(87) PCT Pub. No.: WO2006/129072
PCT Pub. Date: Dec. 7, 2006

(65) Prior Publication Data

US 2008/0198198 A1 Aug. 21, 2008

(30) Foreign Application Priority Data

May 28, 2005 (GB) .................................. 0510991.3

(51) Int. Cl.
*B41J 2/16* (2006.01)
*C23C 16/04* (2006.01)
*B41J 2/175* (2006.01)
*B41J 2/14* (2006.01)

(52) U.S. Cl.
CPC *B41J 2/16* (2013.01); *B41J 2/1606* (2013.01); *B41J 2/164* (2013.01); *B41J 2/17563* (2013.01); *B41J 2002/14362* (2013.01); *B41J 2002/14403* (2013.01)
USPC ............................ 347/45; 347/93; 427/255.6

(58) Field of Classification Search
USPC .............. 347/45, 93, 10, 47, 68, 69; 427/255, 427/445, 255.6
See application file for complete search history.

(56) References Cited

U.S. PATENT DOCUMENTS 4,589,000 A * 5/1986 Koto et al. ...................... 347/68
4,707,705 A 11/1987 Hara et al.
4,947,184 A 8/1990 Moynihan et al.

(Continued)

FOREIGN PATENT DOCUMENTS

EP 0712726 * 5/1996 ................ B41J 2/16
EP 0863008 9/1998

(Continued)

OTHER PUBLICATIONS

Parylene Properties & Characteristics, V&P Scientific, Inc. 2010, 4 pages, website: http://www.vp-scientific.com/parylene_properties.htm.*

(Continued)

*Primary Examiner* — Yogendra Gupta
*Assistant Examiner* — Emmanuel S Luk
(74) *Attorney, Agent, or Firm* — Marshall, Gerstein & Borun LLP

(57) ABSTRACT

A printhead assembly comprising the printhead and filters intended for use with the printhead is passivated by passing a gaseous coating such as Parylene through the assembly. In this way dirt particles created during manufacture of the printhead are encapsulated and thus prevented from blocking the nozzles. The printhead assembly is also prevented from interacting physically or chemically with ink flowing through the printhead.

7 Claims, 2 Drawing Sheets

(56) References Cited

U.S. PATENT DOCUMENTS

| | | | | |
|---|---|---|---|---|
| 5,426,458 | A * | 6/1995 | Wenzel et al. | 347/45 |
| 5,548,894 | A * | 8/1996 | Muto | 29/890.1 |
| 5,653,901 | A * | 8/1997 | Yoshimura | 219/121.71 |
| 6,109,728 | A * | 8/2000 | Kakuda et al. | 347/45 |
| 6,357,867 | B1 * | 3/2002 | Hine | 347/89 |
| 6,450,627 | B1 * | 9/2002 | Moynihan et al. | 347/71 |
| 6,634,733 | B2 * | 10/2003 | Daddey | 347/45 |
| 6,808,250 | B2 * | 10/2004 | Watanabe | 347/45 |
| 6,880,916 | B2 * | 4/2005 | Kim | 347/47 |
| 7,052,122 | B2 * | 5/2006 | Hoisington et al. | 347/92 |
| 7,101,030 | B2 * | 9/2006 | Clark et al. | 347/93 |
| 7,275,817 | B2 * | 10/2007 | Clark et al. | 347/93 |
| 2006/0057503 | A1 * | 3/2006 | Bertelsen et al. | 430/320 |

FOREIGN PATENT DOCUMENTS

| | | | | |
|---|---|---|---|---|
| EP | 1138498 | | 10/2001 | |
| EP | 1308196 | | 5/2003 | |
| JP | 2-500899 | A | 3/1990 | |
| JP | 3-169559 | A | 7/1991 | |
| JP | 07008725 | | 5/1995 | |
| JP | 20011300008 | A * | 5/2001 | B41J 2/16 |
| JP | 2004-17415 | A | 1/2004 | |
| WO | WO-99/24141 | | 5/1999 | |

OTHER PUBLICATIONS

International Search Report for PCT/GB2006/001959 dated Sep. 8, 2006.

International Preliminary Report on Patentability for Application No. PCT/GB2006/001959, dated Dec. 13, 2007.

Examination Report for Application No. EP06744023.0, dated Mar. 3, 2012.

Office Action for Japanese Application No. 2011-17958, dated Jul. 3, 2012.

* cited by examiner

PASSIVATION OF PRINTHEAD ASSEMBLIES AND COMPONENTS THEREFOR

BACKGROUND OF THE INVENTION

1. Field of the Invention

This invention relates to printhead assemblies.

2. Related Technology

With the wide variety of substances currently utilised as 'inks' with printhead technology there is a need for a barrier between the ink and the actuator structures within the printhead. It is desirable that such a barrier prevents the ink from reacting chemically with the actuator structure; this is especially desirable with highly reactive inks. It is also desirable that such a barrier prevents physical interactions, in particular with conductive or metallic inks, which may cause short-circuiting of the printhead where such inks contact the driving electrodes. It is also desirable that the barrier improves ink flow through the printhead. Dirt, dust or other matter that inevitably results from the manufacturing process should be encapsulated during the process in order to prevent such material dislodging and blocking the nozzles during operation of the printhead.

Parylene is known to form a conformal coating within the structure of shared-wall/shear mode printheads of the kind known from EP0277703. It is particularly well suited to page-wide-array designs having a large number of ink inlets and outlets communicating to the channel, as known e.g. from WO 00/29217. It is known to apply Parylene to the printhead to form a layer to eliminate nucleation sites for air bubbles, for example from U.S. Pat. No. 4,947,184 (Spectra Inc.). Details of the Parylene coating process and operating procedures may be found therein.

Within the manufacturing environment it is desirable to protect a printhead actuator from particulate contamination, typically by attaching a nozzle plate at the front of the actuator and a filter at the back.

SUMMARY OF THE INVENTION

The present invention relates to the parylene coating of a filter having a larger pore size, the coating process producing a filter of a desired pore size. In one embodiment of the invention a printhead is assembled with a filter and the whole apparatus then coated with a passivating substance such as parylene. In a further embodiment of the invention an ink filter is coated with a passivating substance separately.

According to a first aspect of the invention there is provided a method for passivating a printhead assembly comprising: assembling the printhead with at least one filter intended for use with the printhead when in operation to create a printhead assembly; passing a fluid or gaseous coating substance through said printhead assembly via said filter, thus forming a passivating layer over at least some of the surfaces of both the printhead and the filter.

According to a second aspect of the invention there is provided a printhead assembly comprising a printhead and ink filter intended for use with the printhead when in operation characterised by having a conformal layer of a coating material on at least some of the surfaces of both the printhead and the filter.

According to third aspect of the invention there is provided a method for making an improved ink filter for use with a printhead characterised by comprising: passing a fluid or gaseous coating over said filter, thus forming a passivating layer over the filter; the filter comprising pores of characteristic size(s) said pore sizes being reduced to a desired value by the passivating layer.

According to a fourth aspect of the invention there is provided an improved ink filter for use with a printhead characterised by comprising a mesh and a passivating layer over said mesh that defines pores of a desired size.

BRIEF DESCRIPTION OF THE DRAWINGS

The present invention will now be described by way of example with reference to the accompanying drawings, in which.

DETAILED DESCRIPTION

Figure 1:
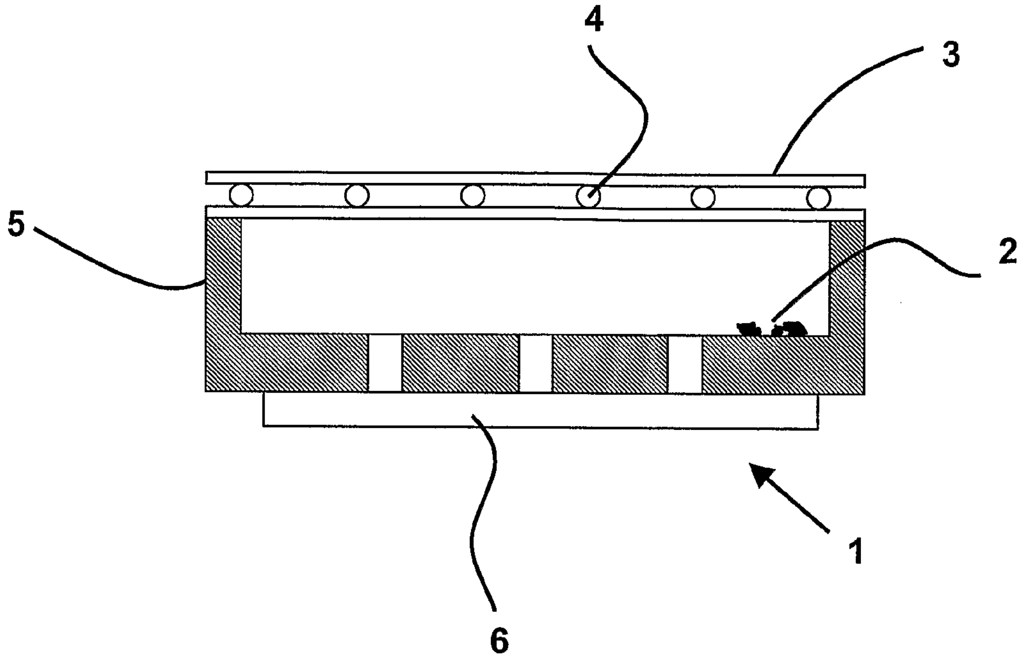
FIG. 1 shows a cross-section through the printhead, including dirt particles, before Parylene coating.

FIG. 1 is a cross sectional view through the printhead 1 comprising a chassis/manifold 5 and an actuator 6. Although care will be taken during manufacture to eliminate all dirt particles 2, absolute cleanliness cannot be guaranteed. A ca. 30 μm filter 3 having mesh 4 will allow particles large enough to block nozzles to enter the chassis/actuator cavities.

Following channel flushing, a blank nozzle plate and filter are attached immediately in order to prevent the ingress of dirt during subsequent processing. This results in increased production yield. This assembly is then taken through the parylene process where a 10 μm layer is added to the outside. The parylene passes along the same path as the ink when the printhead is in use. The process parameters and/or printhead design is tailored to achieve the 3-4 um layer on the actuator walls; a Parylene layer at ca. 10 μm on external surfaces results in a 3-4 μm layer on the channel walls. Moreover, the 10 μm layer, when applied to the 30 μm filter results in the required 10 μm filter having the additional advantage of a lower resistance to fluids as well as improved material compatibility attributable to the Parylene coating of the filter and its mesh.

Figure 2:
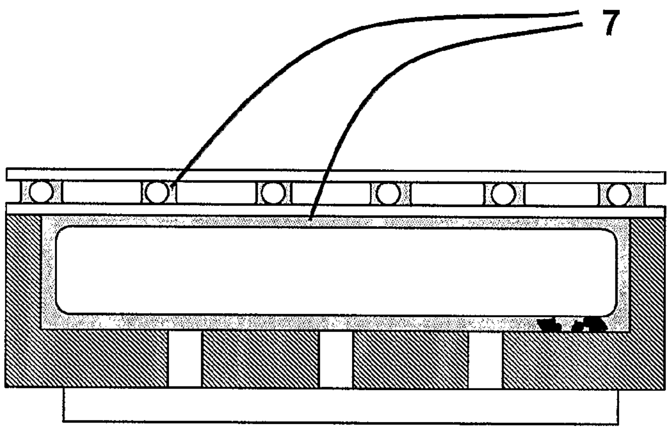
FIG. 2 shows a cross-section through the printhead after Parylene coating, with the dirt particles encapsulated.

FIG. 2 shows the printhead assembly having undergone the coating process according to a first embodiment of the present invention. The interior surfaces are now coated with a thin layer of parylene 7.

Figure 3:
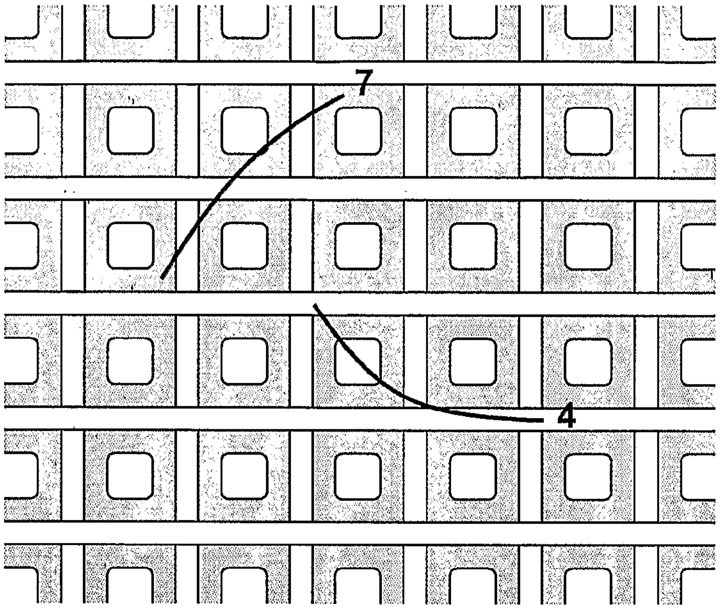
FIG. 3 shows the ink filter after Parylene coating.

FIG. 3 shows a filter formed by the coating process according to a second embodiment of the present invention. The mesh 4 of the filter is now coated with a thin layer of parylene 7, thus reducing the pore size of the filter to a desired value. This may be accomplished by controlling the length of exposure to the parylene vapour in addition to other variables involved in the coating process such as the temperature of the parylene. The details of controlling such a process are well known in the art (again, see U.S. Pat. No. 4,947,184 for detailed discussion of known techniques) and beyond the scope of this document.

An advantage to the method according to the first embodiment is that any dirt in the manifold is over-coated and entrapped by the Parylene such that it can no longer cause risks of nozzle blockage or contamination. There is similar encapsulation of any grains of piezoelectric material that might otherwise be dislodged during the life of the product, e.g. due to prolonged ultrasonic agitation.

Another advantage is that since all assembly processes in the actuator ink path are complete prior to the application of the passivating Parylene layer, all materials in the actuator ink path are afforded protection. Thus actuator materials are protected against chemical attack from the ink and the ink is protected from contamination by the actuator materials.

The application of a passivation layer to the rear of the nozzle plate also provides protection to the adhesive (if used) that attaches the nozzle plate.

The invention claimed is:

1. A method for passivating a printhead assembly comprising the steps of:

assembling a printhead and at least one filter having a plurality of pores and being intended for use with the printhead when in operation;

assembling said printhead with a blank nozzle plate to create a printhead assembly comprising said printhead, said blank nozzle plate, and said at least one filter having a plurality of pores;

passing a fluid or gaseous coating substance through said printhead assembly comprising said printhead, said blank nozzle plate, and said at least one filter having a plurality of pores, via said filter, thus forming a passivating layer over at least some of the surfaces of both the printhead and the filter;

wherein said step of assembling said printhead with a blank nozzle plate to create a printhead assembly takes place prior to said step of passing a fluid or gaseous coating substance through said printhead assembly via said filter; and, subsequent to said step of passing a fluid or gaseous coating substance through said printhead assembly via said filter, the step of forming a plurality of nozzles, each nozzle having a nozzle bore extending through said nozzle plate, and wherein said nozzle bores are free of said coating substance.

2. The method according to claim 1 wherein the filter comprises pores of characteristic size(s), said pore sizes being reduced to a desired value by the passivating layer.

3. The method according to claim 1 wherein the path taken by the coating substance is the path taken by ink when said printhead assembly is in use.

4. The method according to claim 1 wherein said coating substance comprises poly(p-xylylene).

5. The method according to claim 1 wherein said coating substance comprises poly(chloro-p-xylylene).

6. The method according to claim 1, wherein said printhead comprises a manifold portion and an actuator portion, said manifold portion being disposed between said filter and said actuator portion in said assembly.

7. The method of claim 1, wherein said filter is intended for use with the printhead when in operation and further wherein said filter comprises a mesh, said mesh having a plurality of pores.

* * * * *